US009166609B2

(12) United States Patent
Takayama et al.

(10) Patent No.: US 9,166,609 B2
(45) Date of Patent: Oct. 20, 2015

(54) AD CONVERTER AND RECEIVING APPARATUS

(71) Applicant: Panasonic Corporation, Osaka (JP)

(72) Inventors: Masao Takayama, Hyogo (JP); Junichi Naka, Osaka (JP); Naoya Yosoku, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/424,883

(22) PCT Filed: Sep. 2, 2013

(86) PCT No.: PCT/JP2013/005179
§ 371 (c)(1),
(2) Date: Feb. 27, 2015

(87) PCT Pub. No.: WO2014/038173
PCT Pub. Date: Mar. 13, 2014

(65) Prior Publication Data
US 2015/0270845 A1  Sep. 24, 2015

(30) Foreign Application Priority Data

Sep. 7, 2012 (JP) ................................ 2012-197704

(51) Int. Cl.
*H03M 1/12* (2006.01)
*H03M 1/06* (2006.01)
*H03M 1/34* (2006.01)
*H03M 1/36* (2006.01)
*H03M 1/00* (2006.01)

(52) U.S. Cl.
CPC .............. *H03M 1/0624* (2013.01); *H03M 1/34* (2013.01); *H03M 1/36* (2013.01); *H03M 1/00* (2013.01); *H03M 1/12* (2013.01)

(58) Field of Classification Search
CPC .................................. H03M 1/12; H03M 1/00
USPC .................................. 341/155, 158, 156, 120
See application file for complete search history.

(56) References Cited

U.S. PATENT DOCUMENTS

2010/0007541 A1* 1/2010 Shigemori et al. ............. 341/158
2010/0013692 A1 1/2010 Yamamoto et al.

FOREIGN PATENT DOCUMENTS

| JP | 59-144931 A | 8/1984 |
| JP | 4554688 B2 | 9/2010 |
| WO | 2008/020567 A1 | 2/2008 |
| WO | 2008/026440 A1 | 3/2008 |

OTHER PUBLICATIONS

International Search Report for Application No. PCT/JP2013/005179 dated Oct. 29, 2013.

* cited by examiner

*Primary Examiner* — Joseph Lauture
(74) *Attorney, Agent, or Firm* — Pearne & Gordon LLP

(57) ABSTRACT

It is intended to provide an AD converter capable of increasing its conversion accuracy. An AD converter is equipped with a clock generator which generates a first clock using a second clock and a comparator which includes a comparison circuit for comparing an input signal with a prescribed value in a first period of the first clock and a precharging circuit for precharging, in a second period of the first clock, an internal voltage to a prescribed value for the next comparison operation. The clock generator includes a replica circuit of the precharging circuit of the comparator. In the replica circuit of the precharging circuit, a precharging period from the start to the end of precharging is set as the second period of the first clock.

12 Claims, 13 Drawing Sheets

AD CONVERTER AND RECEIVING APPARATUS

TECHNICAL FIELD

The present disclosure relates to an AD converter and a receiving apparatus and, more particularly, to an AD converter etc. which employ clock duty ratio control.

BACKGROUND ART

In recent years, the operation rate of AD converters (analog-to-digital converters, ADCs) has increased and even operation rates higher than 1 GHz are not rare. However, in high-speed operations, it is difficult for comparators to perform a comparison operation. To enable operation of comparators at high frequencies, it is effective to elongate their operation period by controlling the duty ratio of a clock. Necessary conversion accuracy of AD converters can be maintained in this manner.

For example, an AD converter is known which has a comparator that performs a comparison operation during high periods of a clock (refer to Patent document 1, for example). This AD converter is equipped with a replica circuit of a comparator and a clock synthesis circuit which sets, as a high period of a clock, a period that is for a comparison operation of the replica circuit and sets the remaining period as a low period of the clock.

PRIOR ART DOCUMENTS

Patent Documents

Patent document 1: JP-B-4554688

SUMMARY OF THE INVENTION

Problems to be Solved by the Invention

The technique of Patent document 1 is insufficient in the conversion accuracy of the AD converter having the comparator.

An object of the present disclosure is to provide an AD converter capable of increasing its conversion accuracy as well as a related receiving apparatus.

Means for Solving the Problems

An AD converter according to the disclosure comprises a clock generator which generates a first clock using a second clock; and a comparator comprising a comparison circuit which compares an input signal with a prescribed value in a first period of the first clock and a precharging circuit which precharges, in a second period of the first clock, an internal voltage to a prescribed value for a next comparison operation, wherein the clock generator comprises a replica circuit of the precharging circuit of the comparator, and in the replica circuit of the precharging circuit a precharging period from the start to the end of precharging is set as the second period of the first clock.

Advantages of the Invention

The disclosure makes it possible to increase the conversion accuracy of an AD converter.

MODES FOR CARRYING OUT THE INVENTION

Figure 1:
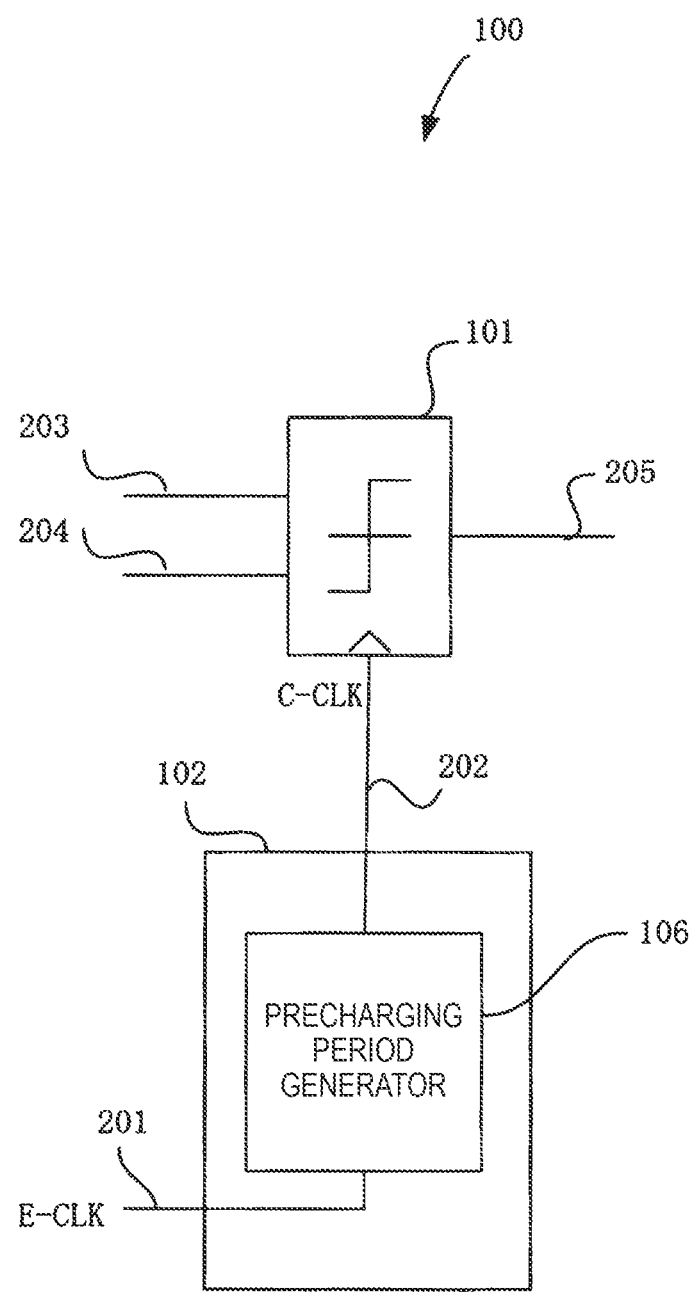
FIG. 1 is a block diagram showing an example configuration of an AD converter according to a first embodiment.

Embodiments of the present disclosure will be hereinafter described with reference to the drawings.

(Background of One Aspect of the Disclosure)

In the AD converter disclosed in Patent document 1, when the difference between voltages to be compared by the comparator is large, a time that is necessary for comparison by the comparator can be determined a high period of a clock. However, when the difference between voltages to be compared is small, the influence of noise (e.g., transistor noise or thermal noise) on the difference between comparison voltages is large. Therefore, the comparison time becomes shorter or longer depending on the magnitude of noise.

When the difference between voltages to be compared is small, the duty ratio is not kept constant for every clock pulse but vary from one clock pulse to another. As the clock high period becomes shorter, the difference between comparison voltages that is necessary for comparison by the comparator increases and the accuracy of the AD converter lowers. Therefore, even though the difference between comparison voltages of the replica circuit is set at a design minimum voltage difference, it is difficult to perform comparison satisfactorily. As a result, the resolution of the AD converter may become equal to or greater than the lowest one, in which case the design accuracy of the AD converter cannot be attained.

Where a clock having a duty ratio 50% is used, the clock high period becomes longer as the clock frequency decreases. On the other hand, in the AD converter disclosed in Patent document 1 the clock high period is determined from the comparison time of the comparator. Therefore, the length of the clock high period does not vary even though the clock frequency is made lower. The ratio of the high period to the clock cycle becomes smaller than in the case of a clock having a duty ratio 50%. Furthermore, the minimum possible difference between voltages for comparison by the comparator remains the same. Thus, it becomes difficult to increase the resolution of the AD converter.

AD converters capable of increasing their conversion accuracy and a related receiving apparatus will be described below.

(Summary of One Aspect of the Disclosure)

A first AD converter according to the disclosure comprises:
a clock generator that generates a first clock using a second clock; and
a comparator comprising:
a comparison circuit that compares an input signal with a prescribed value in a first period of the first clock; and
a precharging circuit that precharges, in a second period of the first clock, an internal voltage to a prescribed value for a next comparison operation,
wherein the clock generator comprises a replica circuit of the precharging circuit of the comparator, and in the replica circuit of the precharging circuit a precharging period from the start to the end of precharging is set as the second period of the first clock.

A second AD converter according to the disclosure is based on the first AD converter, and includes an additional feature that the clock generator generates the first clock on the basis of a delay time in an internal block of the replica circuit of the precharging circuit.

A third AD converter according to the disclosure is based on the first AD converter, and includes additional features:
that the comparator comprises plural stages of internal blocks and a latch circuit;
that the comparison circuit comprises:
an input transistor which is included in a first-stage internal block of the plural stages of internal blocks and receives the input signal; and
a second-stage internal block which is one of the plural stages of internal blocks, is connected to the latch circuit, and constitutes a latch; and
that the precharging circuit comprises a precharging transistor which is included in the first-stage internal block of the plural stages of internal blocks and receives the first clock.

A fourth AD converter according to the disclosure is based on the third AD converter, and includes additional features:
the clock generator comprises plural stages of internal blocks;
a first-stage internal block of the plural stages, among internal blocks, comprises a precharging transistor which receives the second clock and an input transistor which receives a prescribed voltage; and
an internal block that outputs the first clock, among the plural stages of internal blocks, is an internal block formed by changing wiring of the second internal block of the comparison circuit.

A fifth AD converter according to the disclosure is based on any one of the first to fourth AD converters, and includes an additional feature that the clock generator comprises a delay control circuit for adjusting the first period.

A sixth AD converter according to the disclosure is based on any one of the first to fifth AD converters, and includes an additional feature that the first period is equal to the precharging period.

A seventh AD converter according to the disclosure is based on any one of the first to fifth AD converters, and includes an additional feature that the first period is longer than the precharging period.

An eighth AD converter according to the disclosure is based on any one of the first to seventh AD converters, and includes an additional feature that the comparator is a differential comparator.

A ninth AD converter according to the disclosure is based on any one of first to eighth AD converters, and includes an additional feature that the clock generator includes a transistor having the same physical size as a transistor included in the comparator.

A 10th AD converter according to the disclosure is based on any one of the first to eighth AD converters, and includes an additional feature that the clock generator includes a transistor having the same structure as a transistor included in the comparator.

An 11th AD converter according to the disclosure is based on any one of first to 10th AD converters, and includes an additional feature that the AD converter comprises plural comparators which are connected to each other in parallel and receive the same first clock which is output from the clock generator.

A receiving apparatus according to the disclosure is a receiving apparatus which complies with plural communications standard, and the receiving apparatus comprises:
an AD converter;
a second clock generator that generates a second clock to be input to the AD converter according to a communications standard;
a demodulator that demodulates a converted signal which is output from the AD converter according to the communications standard; and
an access controller that determines a method of demodulation processing to be performed by the demodulator and the second clock to be generated by the second clock generator, according to the communications standard,
wherein the AD converter comprising:
a first clock generator that generates a first clock using the second clock; and
a comparator comprising:
a comparison circuit that compares an input signal with a prescribed value in a first period of the first clock; and
a precharging circuit that precharges, in a second period of the first clock, an internal voltage to a prescribed value for a next comparison operation,
wherein the clock generator comprises a replica circuit of the precharging circuit of the comparator, and in the replica circuit of the precharging circuit a precharging period from the start to the end of precharging is set as the second period of the first clock.

Embodiment 1

FIG. 1 shows an example configuration of an AD converter 100 according to a first embodiment. The AD converter 100 is equipped with a comparator 101 and a clock generator 102. The clock generator 102 is equipped with a precharging period generator 106 which includes a replica circuit of the comparator 101.

The comparator 101 performs a comparison operation when a comparator clock 202 that is output from the clock generator 102 is at a high level. In the comparison operation, the comparator 101 compares an input signal 203 with a prescribed value 204 and outputs a comparison result 205. When the comparator clock 202 is at a low level, the comparator 101 performs a precharging operation which is a charging operation for the next comparison operation. Alternatively, the comparator 101 may perform a comparison operation in a case where the comparator clock 202 is at the low level, and perform a precharging operation in a case where the comparator clock 202 is at the high level.

The clock generator 102 receives an external clock 201 and generates the comparator clock 202 whose polarity is inverted periodically. The comparator clock 202 has the same cycle as the external clock 201. In the clock generator 102, in a first period of the comparator clock 202, the clock polarity of is set to a polarity (e.g., low) with which the comparator 101 is to perform a precharging operation. The first period corresponds to a delay time in internal blocks of the precharging period generator 106. On the other hand, in the clock generator 102, in a second period (i.e., the period other than the first period), the clock polarity of is set to a polarity (e.g., high) with which the comparator 101 is to perform a comparison operation.

In the drawings, the external clock 201 may also be denoted by "E-CLK" and the comparator clock 202 may also be denoted by "C-CLK."

Figure 2:
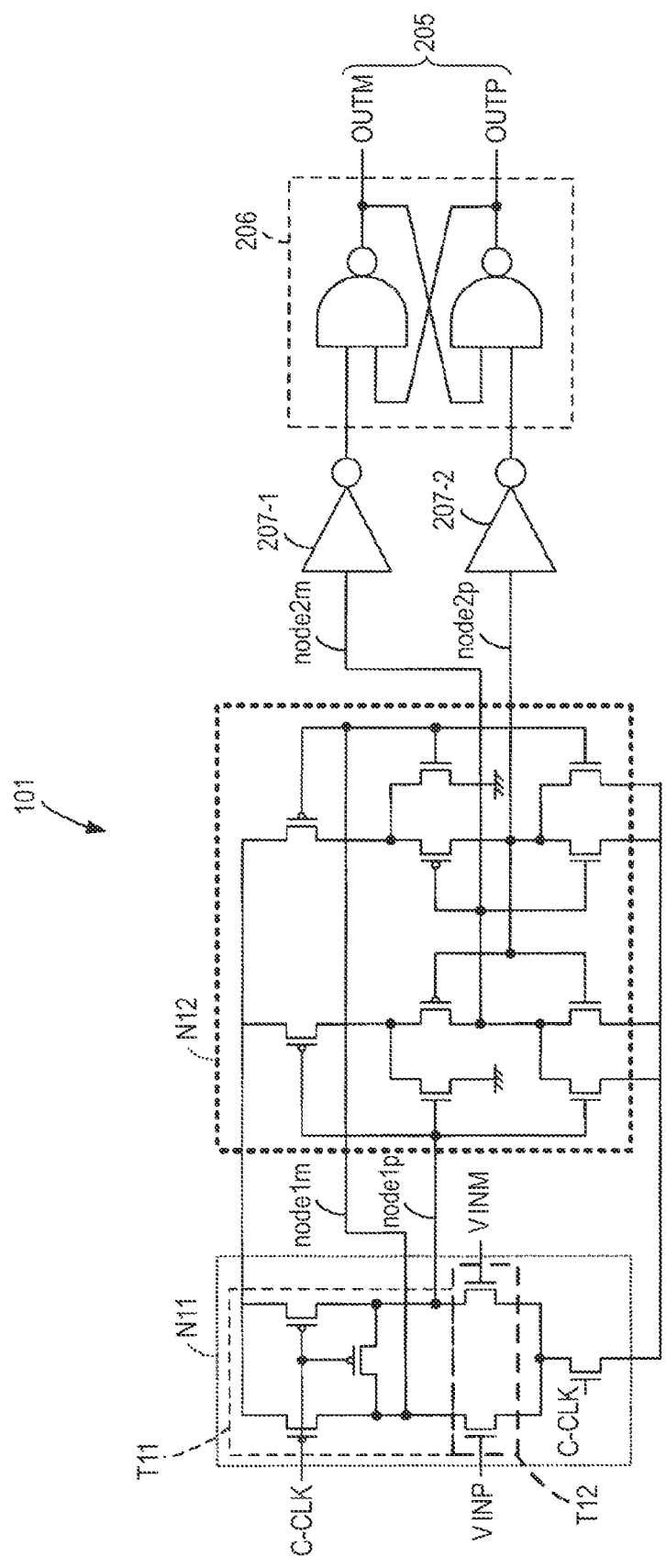
FIG. 2 shows an example circuit of a comparator used in the first embodiment.

Next, the comparator 101 will be described in detail. FIG. 2 shows an example circuit of the comparator 101. The comparator 101 includes plural stages of internal blocks. Although this example circuit includes two stages of internal blocks, the comparator 101 may include three or more stages of internal blocks. A first-stage internal block N11 includes a precharging transistor T11 and an input transistor T12.

The comparator clock (C-CLK) 202 is input to the precharging transistor T11. Plural signals VINP and VINM are input to the input transistor T12. VINP and VINM are two input signals to be compared by the comparator 101 and are, for example, an input signal 203 and a prescribed value 204, respectively.

Node1$p$ and Node1$m$ are outputs of the first-stage internal block N11 of the comparator 101, that is, a positive-side output signal and a negative-side output signal, respectively. Node2$p$ and Node2$m$ are outputs of a second-stage internal block N12 of the comparator 101, that is, a positive-side output signal and a negative-side output signal, respectively. The internal block N12 constitutes a NOR latch.

Node2$p$ and Node2$m$ are connected to respective inverters 207, which are connected to a NAND latch circuit 206. Although in FIG. 2 the inverters 207 are used, they may be omitted. In this case, a NOR latch circuit is used in place of the NAND latch circuit 206. That is, the comparator 101 has a latch configuration as a whole.

The NAND latch circuit 206 outputs OUTM and OUTP as a comparison result 205. Although in FIG. 1 the comparison result 205 is represented by a single line, it includes OUTM and OUTP. The comparison result 205 may be either OUTM or OUTP.

As described above, in the configuration of the comparator 101 shown in FIG. 2, the precharging transistor T11 is an internal block for a precharging operation and the input transistor T12, the internal block N12, the inverters 207, and the NAND latch circuit 206 are internal blocks for an operation of comparison between the input signal and the prescribed value.

Figure 3:
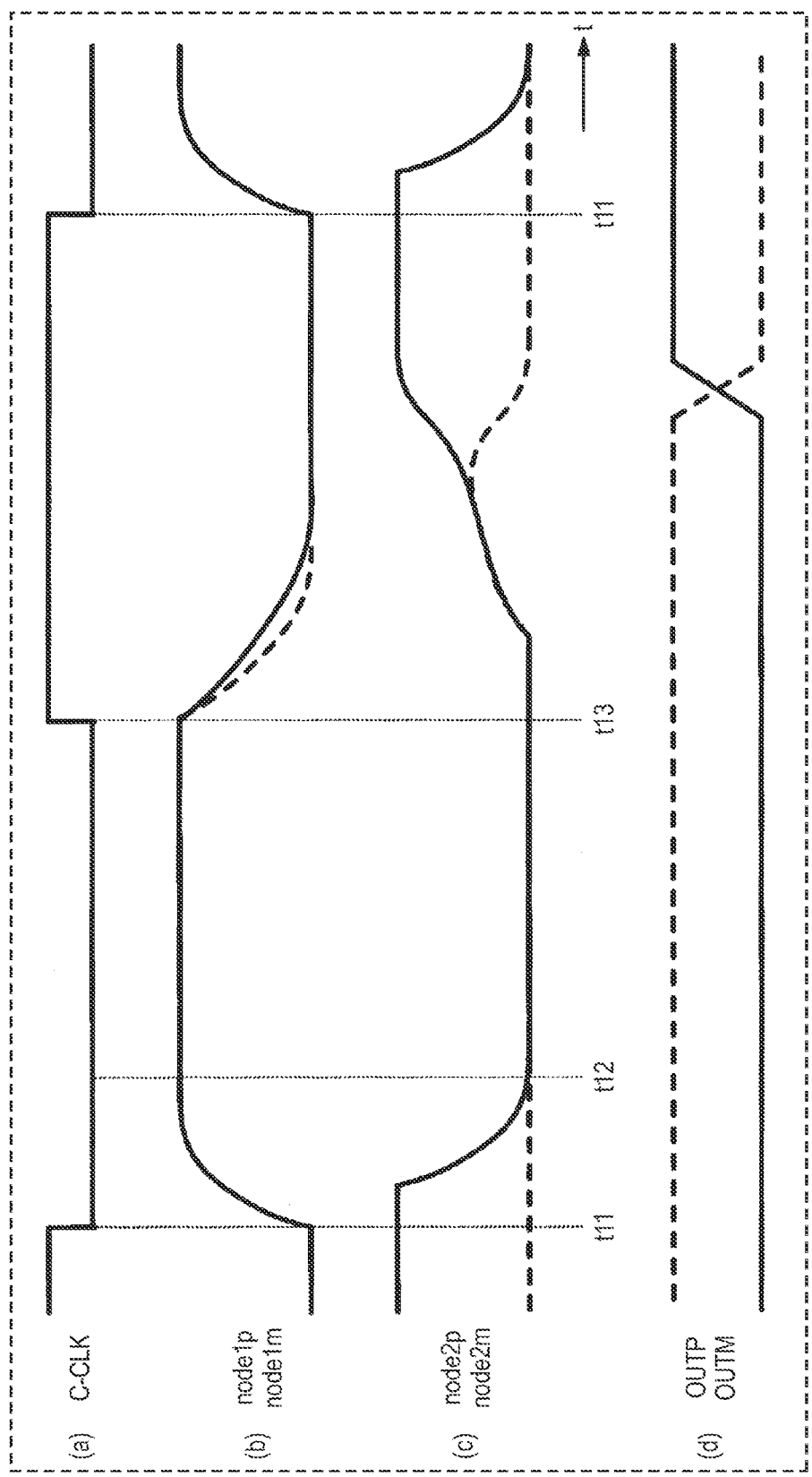
FIG. 3 is an example timing chart of the comparator used in the first embodiment.

FIG. 3 is an example timing chart of the comparator 101. FIG. 3($a$) shows an example output form of the comparator clock 202. FIG. 3($b$) shows example output forms of Node1$p$ and Node1$m$. FIG. 3($c$) shows example output forms of Node2$p$ and Node2$m$. FIG. 3($d$) shows example output forms of OUTM and OUTP.

When the comparator clock (C-CLK) 202 falls at time t11 (i.e., a low period starts), a precharging operation of the comparator 101 is started and Node1$p$ and Node1$m$ rise from the ground potential to a power source potential. When Node1$p$ and Node1$m$ then reach a prescribed voltage, one of Node2$p$ and Node2$m$ is kept at the ground potential and the other falls from the power source potential to the ground potential.

For example, the precharging period is a period from time t11 when Node1$p$ and Node1$m$ rise from the ground potential (rising edge) to time t12 when the other of Node2$p$ and Node2$m$ becomes equal to the ground potential.

It is desirable that the precharging period be sufficiently long because a difference between Node1$p$ and Node1$m$ or Node2$p$ and Node2$m$ affects the next comparison operation and disables a correct comparison.

When the comparator clock 202 rises at time t13 (i.e., a high period starts), a comparison operation is started and Node1$p$ and Node1$m$ fall from the power source potential to the ground potential. Because of the potential difference between VINP and VINM, a difference occurs between fall speeds of Node1$p$ and Node1$m$.

When the potential of VINP is higher than that of VINM, Node1$m$ falls faster than Node1$p$. When Node1$p$ and Node1$m$ fall, Node2$p$ and Node2$m$ rise. However, since the second-stage internal block N12 has a latch configuration, Node2$p$ and Node2$m$ do not rise together.

When Node1$p$ (broken line) falls faster than Node1$m$ (solid line) as shown in FIG. 3($b$), Node2$m$ rises faster than Node2$p$ and suppresses the rise of Node2$p$. Therefore, as shown in FIG. 3($c$), Node2$m$ (solid line) continues to rise and Node2$p$ (broken line) returns to the ground potential.

On the other hand, when the potential of VINP is lower than that of VINM, Node1$p$ (broken line) falls faster than Node1$m$ (solid line) as shown in FIG. 3($b$). When Node1$p$ and Node1$m$ fall, Node2$p$ and Node2$m$ rise as shown in FIG. 3($c$). However, since the second-stage internal block N12 has a latch configuration, Node2$p$ and Node2$m$ do not rise together.

When Node1$p$ falls faster than Node1$m$ as shown in FIG. 3($b$), Node2$m$ rises faster than Node2$p$ and suppresses the rise of Node2$p$ as shown in FIG. 3($c$). Therefore, Node2$m$ (solid line) continues to rise and Node2$p$ (broken line) returns to the ground potential.

Therefore, the comparison result 205 becomes high in a case where the potential of VINP is higher than that of VINM, and becomes low in a case where the potential of VINP is lower than that of VINM.

Alternatively, the comparator 101 may be provided with another set of VINP and VINM so as to have a differential configuration. Each of the input signal 203 and the prescribed value 204 (reference signal) is also changed to differential signals. Where the comparator 101 has the differential configuration and receives differential input signals, since two input signals can be input to the comparator 101, in the comparator 101 the signal power can be doubled and the influence of noise can be halved.

Figure 4:
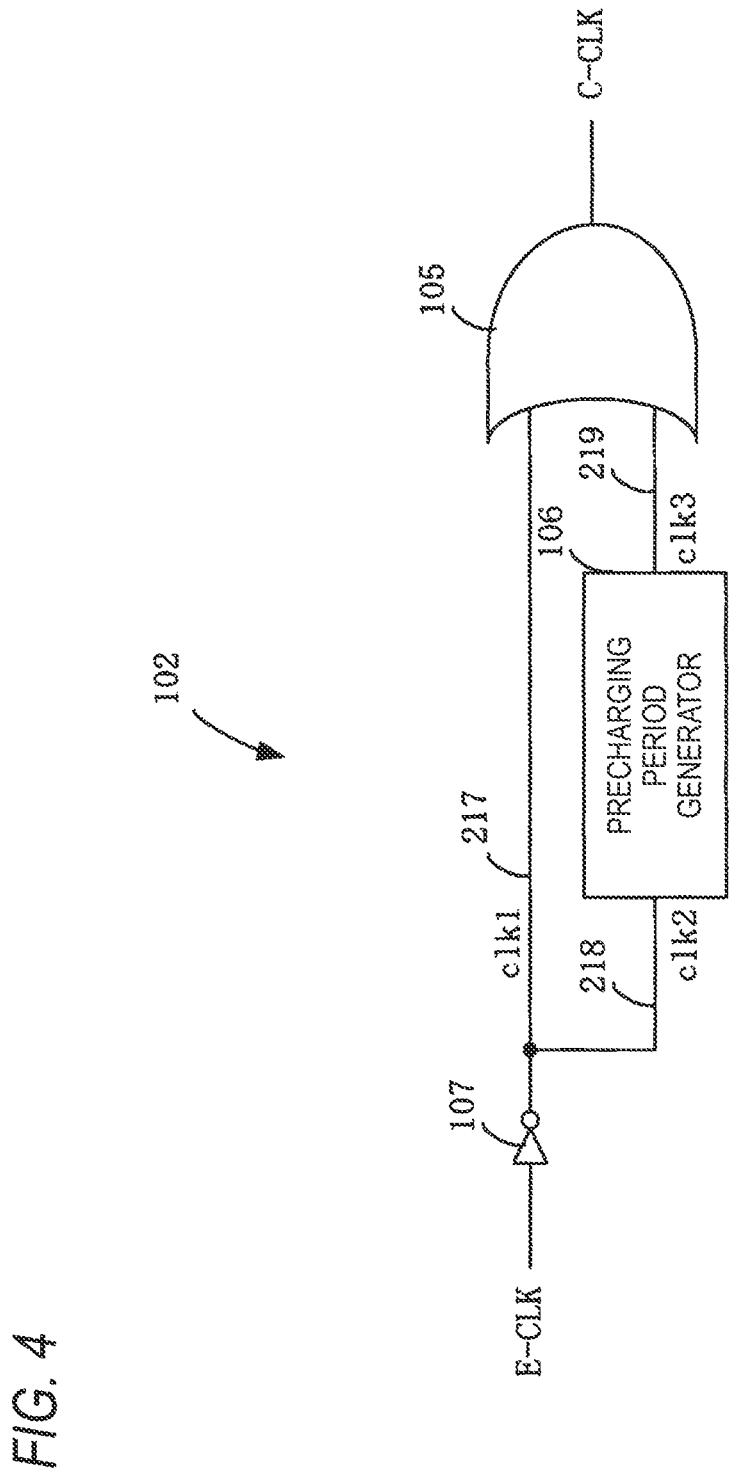
FIG. 4 shows a first example circuit of a clock generator used in the first embodiment.

Next, the clock generator 102 will be described in detail. FIG. 4 shows a first example circuit of the clock generator 102.

The clock generator 102 receives the external clock 201 via an inverter 107 and causes it to branch into a first clock 217 and a second clock 218. The first clock 217 and the second clock 218 have the same phase.

The precharging period generator 106 receives the second clock 218, logically inverts it, delays an inversion result by the precharging period of the comparator 101, and outputs a resulting third clock 219. An OR circuit 105 receives the first clock 217 and the third clock 219 and outputs an ORed result as the comparator clock 202.

In the drawings, the first clock 217, the second clock 218, and the third clock 219 may also be denoted by "clk1," "clk2," and "clk3," respectively.

Figure 5:
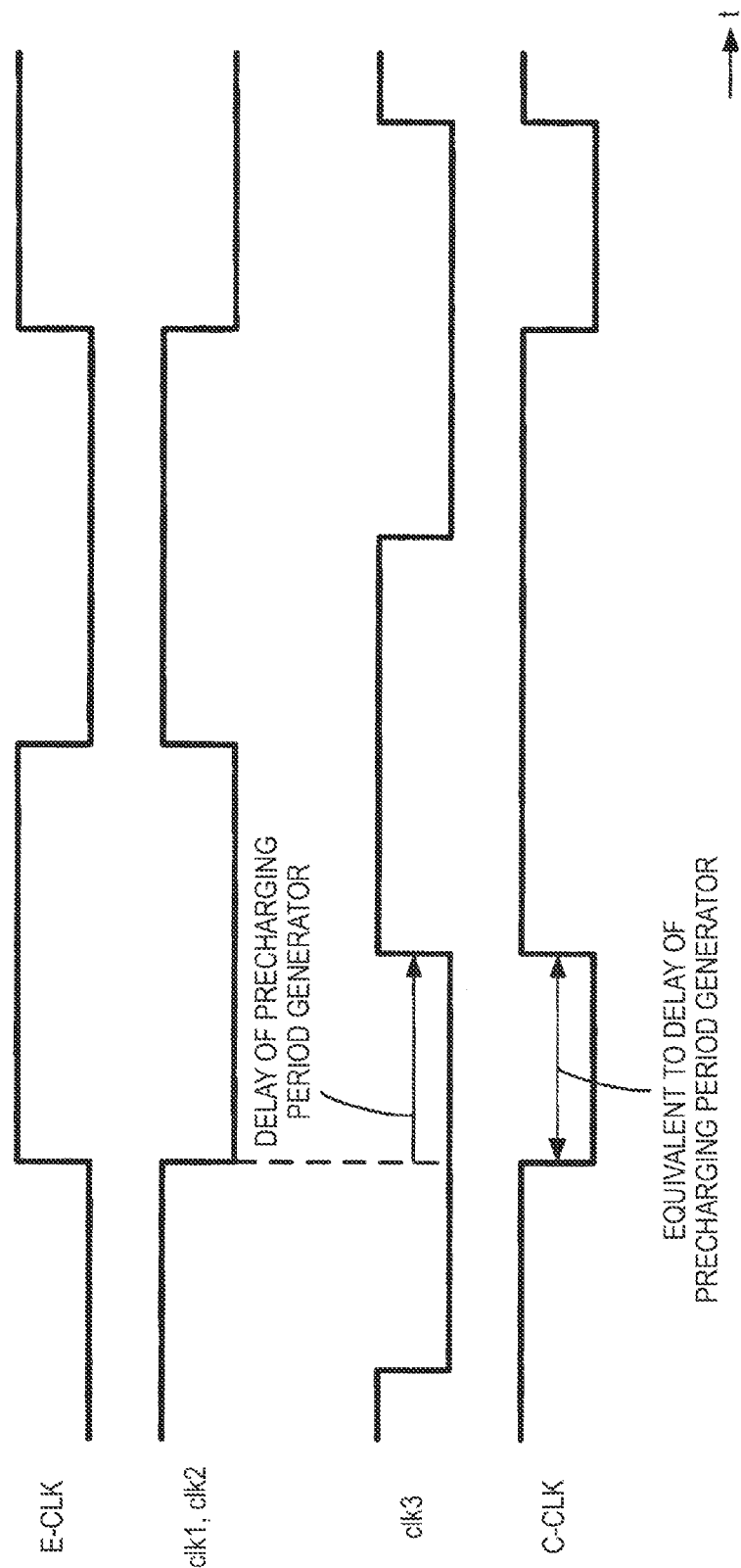
FIG. 5 is a timing chart of the clock generator used in the first embodiment.

FIG. 5 is an example timing chart of the first example circuit of the clock generator 102. FIG. 5 shows output examples of the first clock 217, the second clock 218, the third clock 219, and the comparator clock 202.

The first period of the comparator clock 202 is a delay period that is caused by operations of internal blocks of the precharging period generator 106 and is a period (precharging mock operation period) corresponding to the precharging period of the comparator 101. In the example of FIG. 5, the comparator clock 202 which is output from the clock generator 102 goes low in the precharging period.

Figure 6:
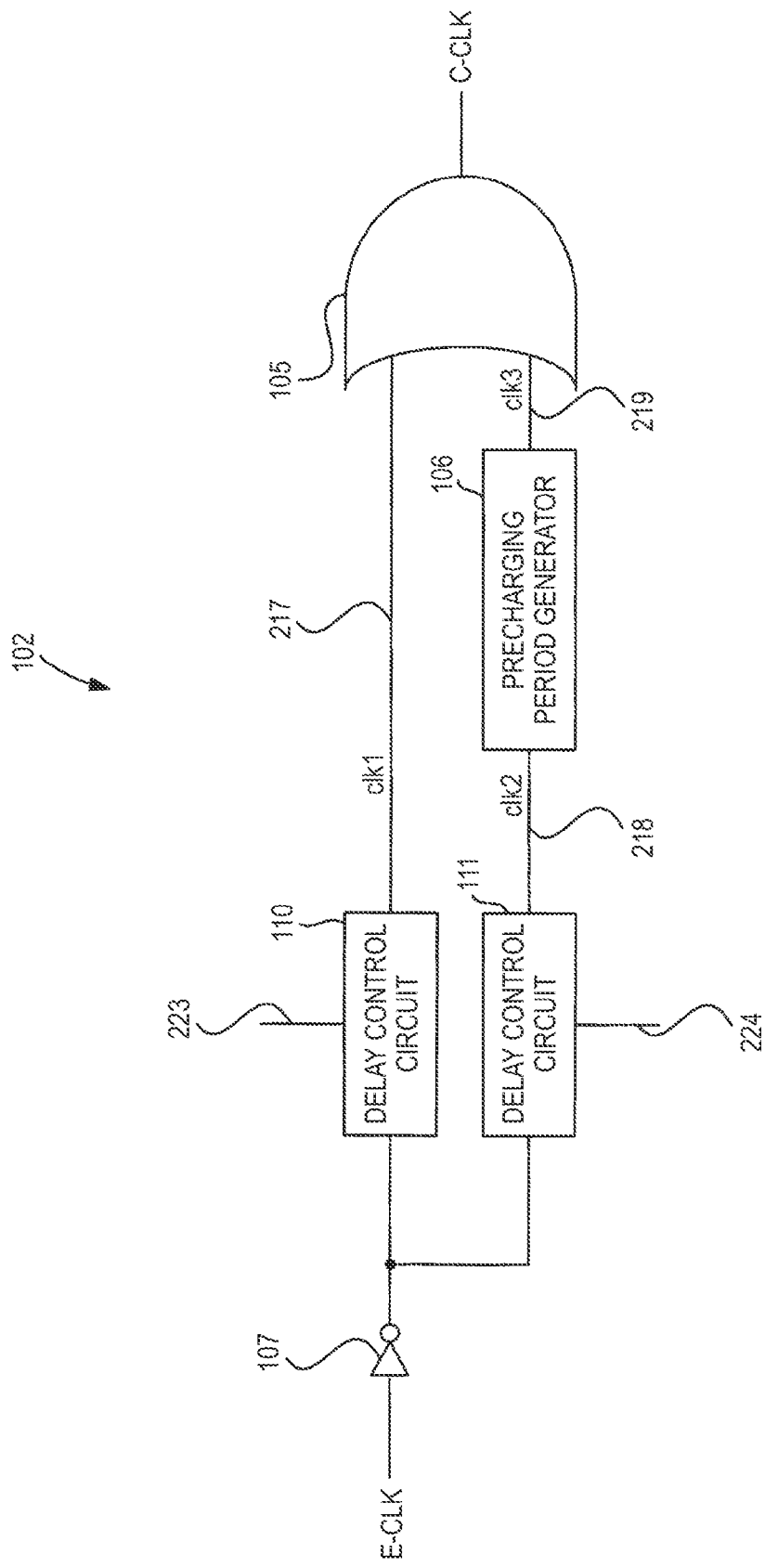
FIG. 6 shows a second example circuit of the clock generator used in the first embodiment.

FIG. 6 shows a first example circuit of the clock generator 102.

The clock generator 102 shown in FIG. 6 can adjust the first period of the comparator clock 202 which corresponds to the precharging period of the comparator 101. In the clock generator 102 shown in FIG. 6, delay control circuits 110 and 111 are inserted upstream of an OR circuit 105 and the precharging period generator 106, respectively.

The delay control circuits 110 and 111 are circuits for adjusting the first period of the comparator clock 202. Equipped with the delay control circuits 110 and 111, the clock generator 102 can estimate the precharging period of the comparator 101 with higher accuracy and hence can precharge the comparator 101 properly.

For example, the delay control circuit 110 controls the delay time according to a first delay control signal 223 which is input externally. For example, the delay control circuit 111 controls the delay time according to a second delay control signal 224 which is input externally.

The first period of the comparator clock 202 becomes shorter when the delay time of the delay control circuit 110 is elongated or the delay time of the delay control circuit 111 shortened. On the other hand, the second period of the comparator clock 202 becomes longer when the delay time of the delay control circuit 110 is elongated or the delay time of the delay control circuit 111 shortened.

In a case where the comparator 101 performs a precharging operation, when a difference exists between Node1$p$ and Node1$m$ or between Node2$p$ and Node2$m$, the difference between the nodes results in an error in the next comparison operation. When the precharging period is set long, Node1$p$ and Node1$m$ are stabilized to become equal to the power source voltage and Node2$p$ and Node2$m$ are stabilized to become equal to the ground potential, resulting in a small error in the next comparison operation. The precharging period can be set long by setting the first period of the comparator clock 202 longer than the precharging period of the comparator 101.

Figure 7:
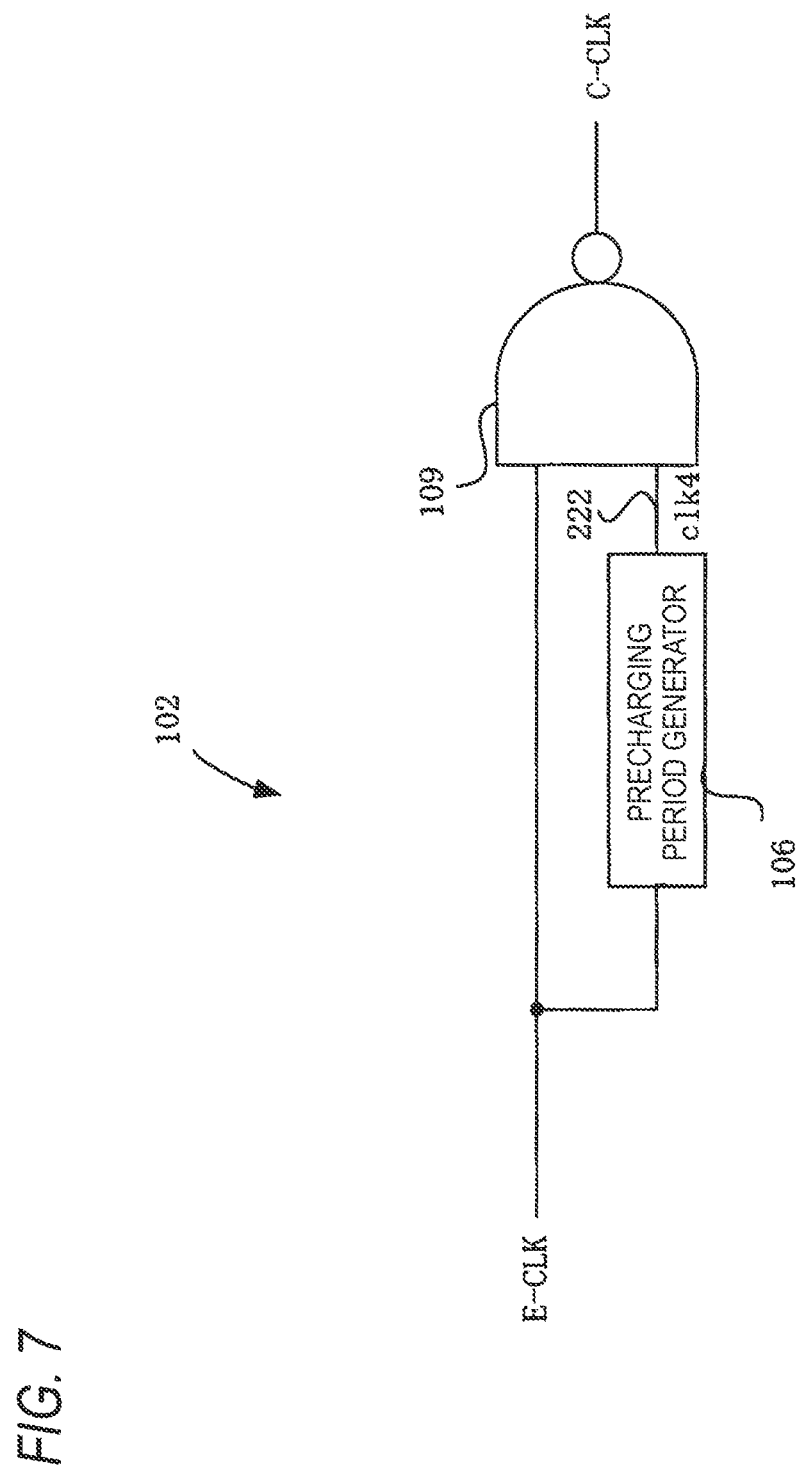
FIG. 7 shows a third example circuit of the clock generator used in the first embodiment.

FIG. 7 shows a third example circuit of the clock generator 102, which is different from the first example circuit of the clock generator 102 in that the former is not equipped with the inverter 107 and a NAND circuit 109 replaces the OR circuit 105. Because of the absence of the inverter 107, the external clock 201 is supplied to the NAND circuit 109 and the precharging period generator 106 without being inverted. The NAND circuit 109 receives the external clock 201 and a fourth clock 222 that is output from the precharging period generator 106 and performs a logical operation on them. In the drawings, the fourth clock 222 is also denoted by "clk4."

Also in the third example circuit of the clock generator 102, the delay time (first period) of the delay period generator 106 (i.e., first period) corresponds to the precharging period of the comparator clock 202.

In the clock generator 102, blunting of a high-frequency signal can be suppressed by inserting a buffer downstream of the branching point of the external clock 201.

Next, the precharging period generator 106 will be described in detail.

Figure 8:
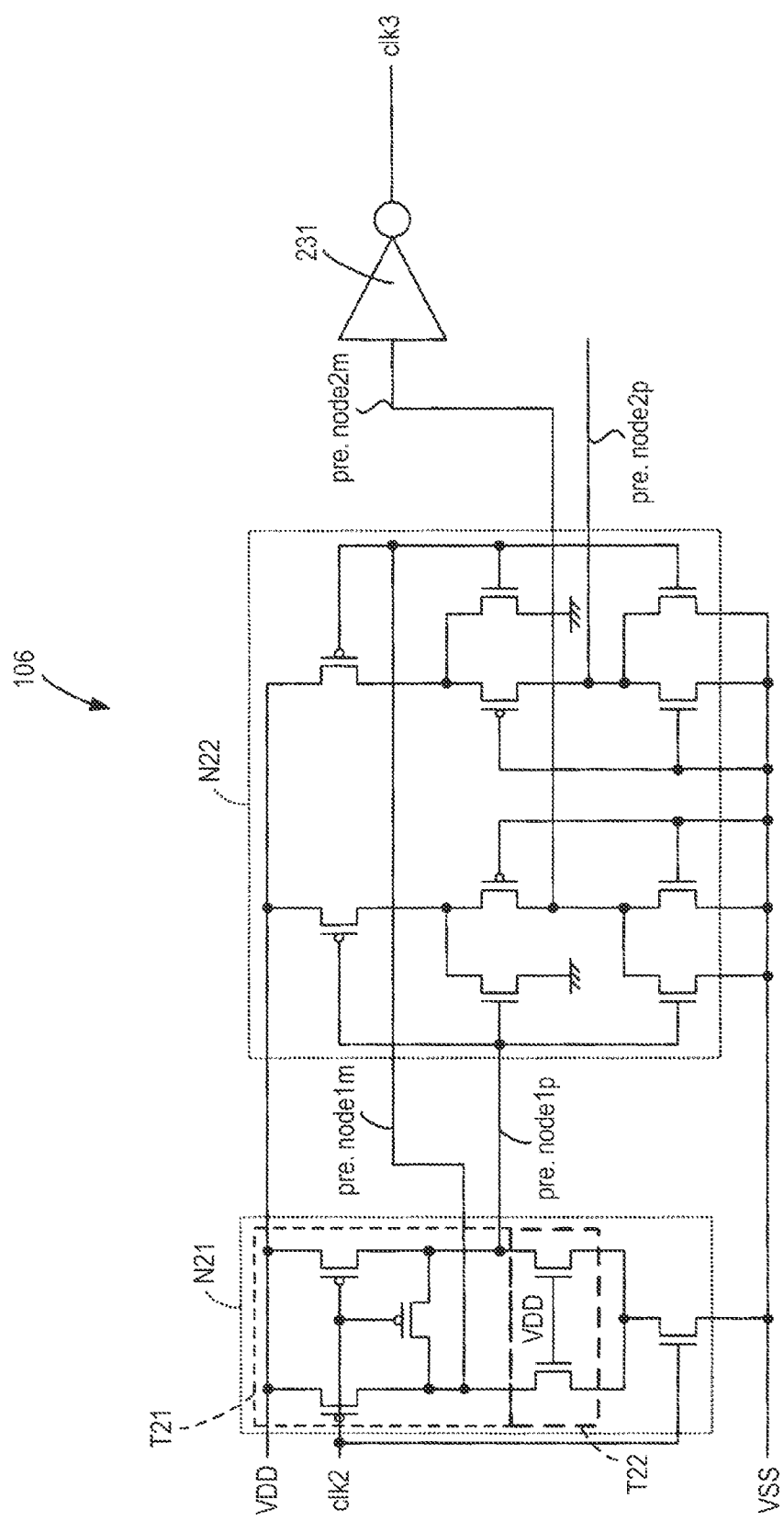
FIG. 8 shows a first example circuit of a precharging period generator used in the first embodiment.
Figure 9:
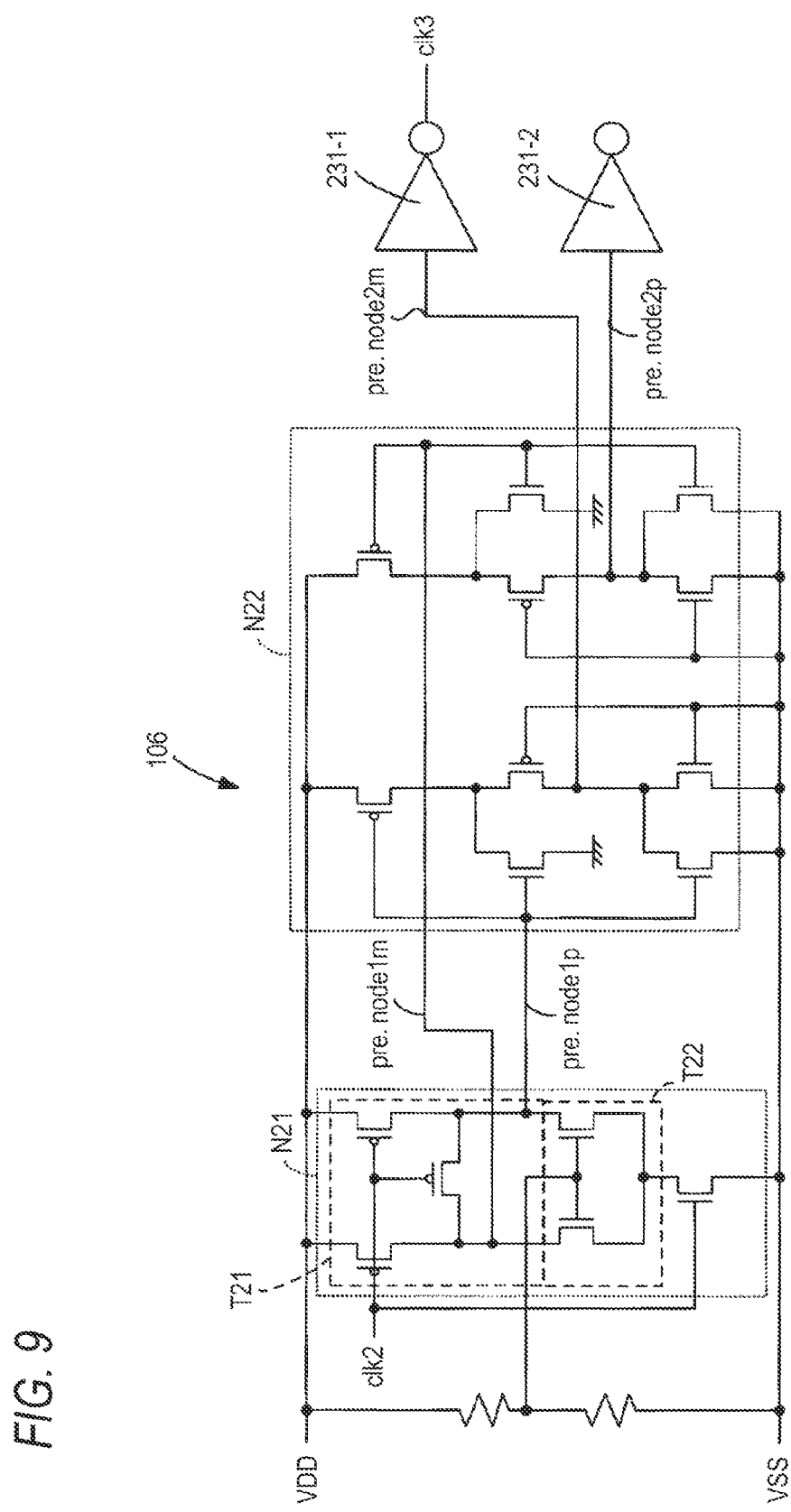
FIG. 9 shows a second example circuit of a precharging period generator used in the first embodiment.

FIG. 8 shows a first example circuit of the precharging period generator 106. FIG. 9 shows a second example circuit of the precharging period generator 106.

To check a precharging operation of the comparator 101, the precharging period generators 106 perform a precharging mock operation which is a simulated version of the precharging operation. In the precharging period generators 106 shown in FIGS. 8 and 9 include a replica circuit of the comparator 101. The replica circuit includes a part, relating to the precharging operation, of the comparator 101. For example, the precharging period generators 106 include the same number of transistors as the comparator 101.

More specifically, like the comparator 101, the precharging period generators 106 include plural stages of internal blocks. Although this example circuit includes two stages of internal blocks, the precharging period generators 106 may include three or more stages of internal blocks. A first-stage internal block N21 includes a precharging transistor T21 and an input transistor T22. For example, the precharging period generators 106 include the same number of transistors as the comparator 101.

On the other hand, the precharging period generators 106 do not include any circuit corresponds to the NAND latch circuit 206 (which does not influence the precharging operation) of the comparator 101. An internal block N22 is different in wiring from the internal block N12 of the comparator 101 shown in FIG. 2 and is not connected to the NAND latch circuit 206; the internal block N22 does not have a latch configuration. When clk2 goes high, each of pre.Node2$p$ and pre.Node2$m$ can rise. Therefore, the first period which corresponds to the precharging period is kept constant without depending on the potential difference between the input signals. The second period which corresponds to the comparison period is also kept constant.

The second clock 218 is input to the precharging transistor T21. A prescribed voltage (e.g., power source voltage VDD) is input to the input transistor T22. A prescribed voltage that is higher than or equal to 0.6 V may be input instead of VDD.

Signals pre.Node1$p$ and pre.Node1$m$ are outputs of the first-stage internal block N21 of the precharging period generators 106, that is, a positive-side output signal and a negative-side output signal, respectively. Signals pre.Node2$p$ and pre.Node2$m$ are outputs of the second-stage internal block N22 of the precharging period generators 106, that is, a positive-side output signal and a negative-side output signal, respectively.

The signal pre.Node2$m$ is input to an inverter 231. An output of the inverter 231 is output as the third clock 219. Since the inverter 231 is disposed downstream of the output point of pre.Node2$m$, inverter 231 functions as a load and the delay time of the precharging period generators 106 is made equal to the precharging time of the comparator 101.

Figure 10:
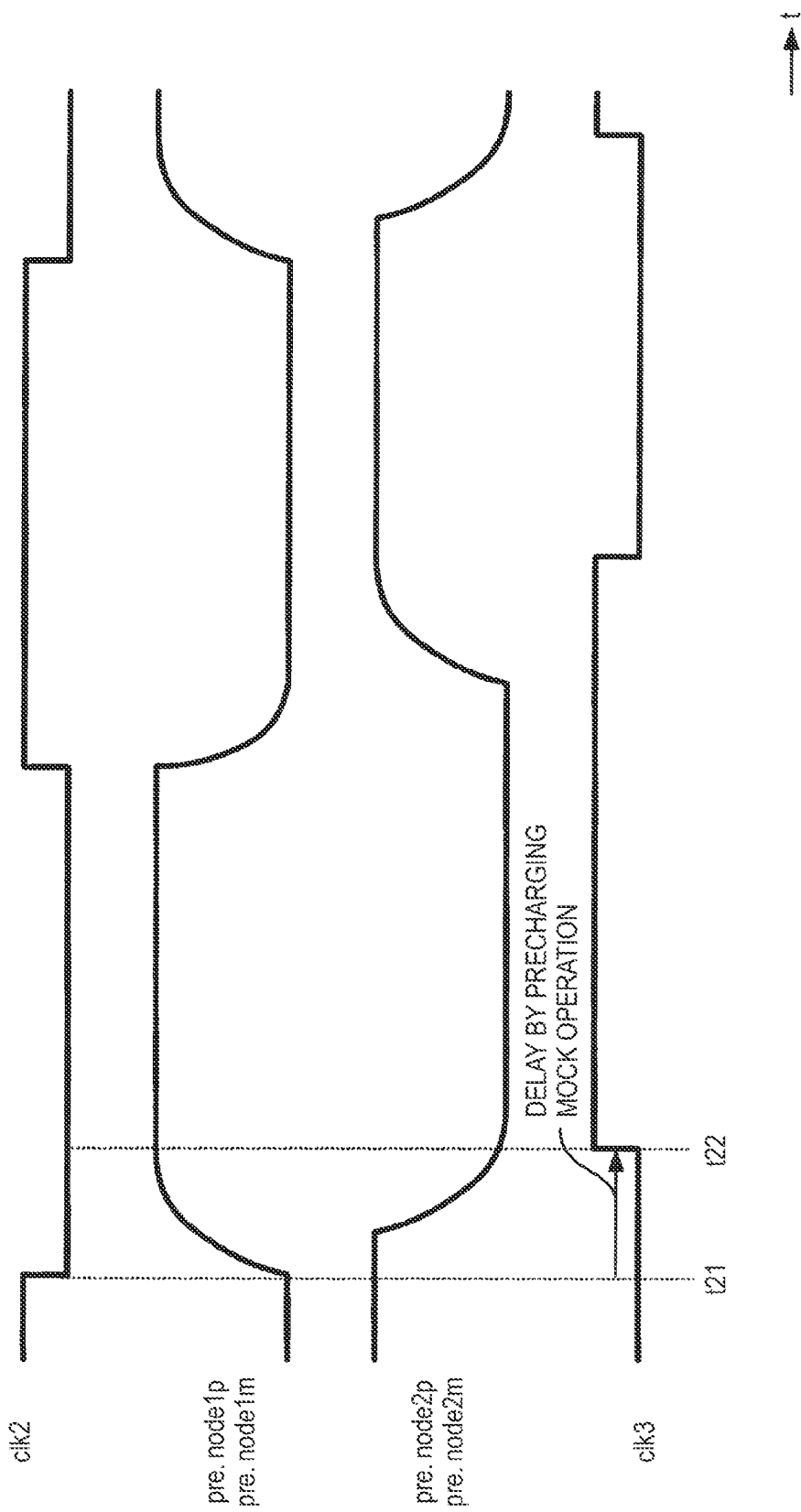
FIG. 10 is an example timing chart of the precharging period generators used in the first embodiment.

FIG. 10 is an example timing chart of the precharging period generators 106. When the second clock 218 falls which is the input of the precharging period generator 106, pre.Node1$p$ and pre.Node1$m$ rise (to the power source potential, for example). And pre.Node2$p$ and pre.Node2$m$ fall (to the ground potential, for example). That is, the third clock 219 which is the output of the precharging period generators 106 rises when pre.Node1$p$ and pre.Node1$m$ have become larger than or equal to the prescribed value and pre.Node2$p$ and pre.Node2$m$ have become smaller than the prescribed value.

In the precharging period generators 106, a start time point and an end time point of the first period may be determined on the basis of time points when the voltages in the internal blocks N21 and N22 have reached the prescribed value (e.g., power source potential and ground potential). This makes it possible to estimate a precharging period of the comparator 101.

The precharging mock operation of the precharging period generators 106 is the same as the precharging operation of the comparator 101. Therefore, the delay time (first period) generated by the precharging period generators 106 is equal to the delay time of the precharging operation of the precharging period generators 106. Since the first period is made equal to the precharging period, the first period can be set shortest and the second period which corresponds to the comparison period can be set longer. Therefore, the lowest resolution of the comparator 101 can be increased.

An object of the precharging mock operation is to simulate the precharging operation of the comparator 101 and thereby generates a delay time corresponding to the precharging period. Therefore, the precharging period generators 106 need not include all of the transistors included in the comparator 101. That is, it suffices that the precharging period generators 106 include transistors that are the same in configuration as part of the transistors included in the comparator 101; the other part may be omitted. The omission of the part of the transistors allows the precharging period generator 106 to be reduced in area and power consumption.

For example, the transistors included in the comparator 101 may have the same physical sizes as those included in the precharging period generators 106. The physical size is L/W sizes (longitudinal/lateral) sizes, for example. Equalizing the physical size makes it possible to simulate the precharging operation correctly.

The precharging operation of the comparator 101 is performed in the precharging period, that is, time t11 to time t12 (see FIG. 3). The precharging period corresponds to the precharging mock operation period (first period), that is, time t21 to time t22 (see FIG. 10).

As shown in FIG. 10, in a precharging mock operation, all of the internal blocks (in the examples, internal blocks N21 and N22) perform a full-amplitude operation between the ground potential and the power source potential. That is, in terms of digital circuits, they operate so that the signals reach the ground potential or the power source potential. This is because the internal block N22 shown in each of FIGS. 8 and 9 does not include a latch structure. Therefore, even at the occurrence of noise of very small voltages (e.g., transistor noise or thermal noise of ±1 mV), the delay time does not vary to a large extent for the precharging operation.

It is necessary to secure a time for comparison between minimum-difference input voltages of signals to be compared by the comparator 101. To this end, first, a time that is necessary for comparison between minimum-difference input voltages to be input to the input transistor T12 of the comparator 101 is calculated. Then the comparator 101 is designed so as to complete its precharging operation in a period that is one cycle of the comparator clock 202 minus the calculated time. The falling point of clk3 may be located at anywhere in the high period of clk2. As shown in FIG. 10, it is appropriate for clk3 to fall when, for example, pre.Node1$p$ and pre.Node1$m$ have reached the ground potential or pre.Node2$p$ and pre.Node2$m$ have reached the power source potential.

In the precharging period generators 106, the first period of the comparator clock 202 which corresponds to the precharging period of the comparator 101 can be determined on the basis of a full-amplitude precharging mock operation. In a precharging mock operation which is a full-amplitude operation, the first period of the comparator clock 202 which corresponds to the precharging period of the comparator 101 does not vary and the duty ratio of the comparator clock 202 is kept constant for every clock pulse. Therefore, the lowest resolution of the comparator 101 can be kept the same for every clock pulse.

Assume that the delay control circuit 111 shown in FIG. 6 is inserted upstream of the precharging period generators 106. In this case, pre.Node1$p$ and pre.Node1$m$ can be settled reliably so as to reach VDD and pre.Node2$p$ and pre.Node2$m$ can be settled reliably so as to reach the power supply potential. This prevents an event that a logic operation (comparison operation) starts before completion of precharging.

Next, the clock frequency of the comparator clock 202 will be described.

Figure 11:
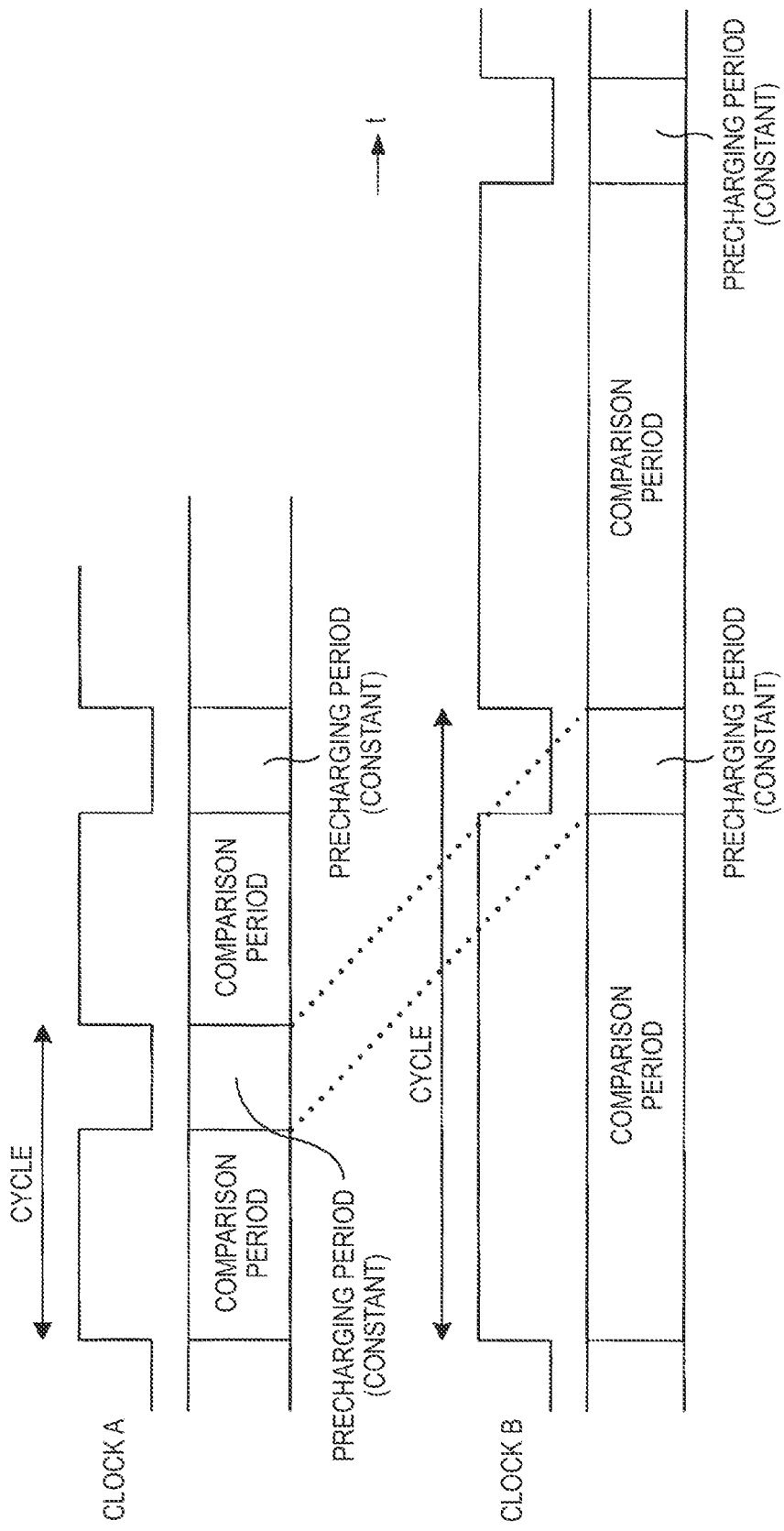
FIG. 11 shows comparator clocks having different clock frequencies in the first embodiment.

FIG. 11 shows example clock frequencies of the comparator clock 202. Clock A and clock B are examples of the comparator clock 202. The cycle of clock A is shorter than that of clock B.

The cycle of the comparator clock 202 minus the first period which corresponds to the precharging period is the second period which corresponds to the comparison period. As described above, the first period does not vary with the clock frequency. Therefore, when the clock frequency is decreased, the second period can be elongated by an increase of the clock cycle. As the comparison period of the comparator 101 becomes longer, the lowest resolution becomes small, that is, the resolution is improved. That is, the lowest resolution of the comparator can make small by elongating the second period of the comparator clock 202.

The AD converter 100 is equipped with the comparator and the clock generator 102. The comparator includes the comparison circuit for comparing an input signal with a prescribed value in a first period of a first clock and the precharging circuit for precharging, in a second period of the first clock, an internal voltage to a prescribed value for the next comparison operation. The clock generator 102 generates the first clock using a second clock. The clock generator 102 includes the replica circuit of the precharging circuit of the comparator. In the replica circuit of the precharging circuit, a period from the start to the end of precharging is set as the second period of the first clock.

The comparator is the comparator 101, for example. The first clock is the comparator clock 202, for example. The second clock is the external clock 201, for example.

According to the AD converter 100, the first period is constant receiving almost no influence from noise because a precharging mock operation is a full-amplitude operation. Furthermore, instead of a scheme that the high period of the clock is determined from a comparison time of the replica circuit of the comparator, the low period of the clock is determined from a period of the replica circuit corresponding to a precharging period of the comparator.

The low period of the clock is determined to be a constant period and the remaining period is set as a high period. Therefore, when the clock frequency is decreased, the high period is elongated by an increase of the cycle and the minimum possible difference between voltages for comparison by the comparator is decreased accordingly. Thus, the resolution of the AD converter is made higher.

Since the duty ratio of the clock of the comparator 101 is kept constant for every clock pulse, the lowest resolution of the comparator 101 can be kept the same for every clock pulse. The SNR (signal-to-noise ratio) is made the same as a design value, which enables high-accuracy measurements.

Embodiment 2

Figure 12:
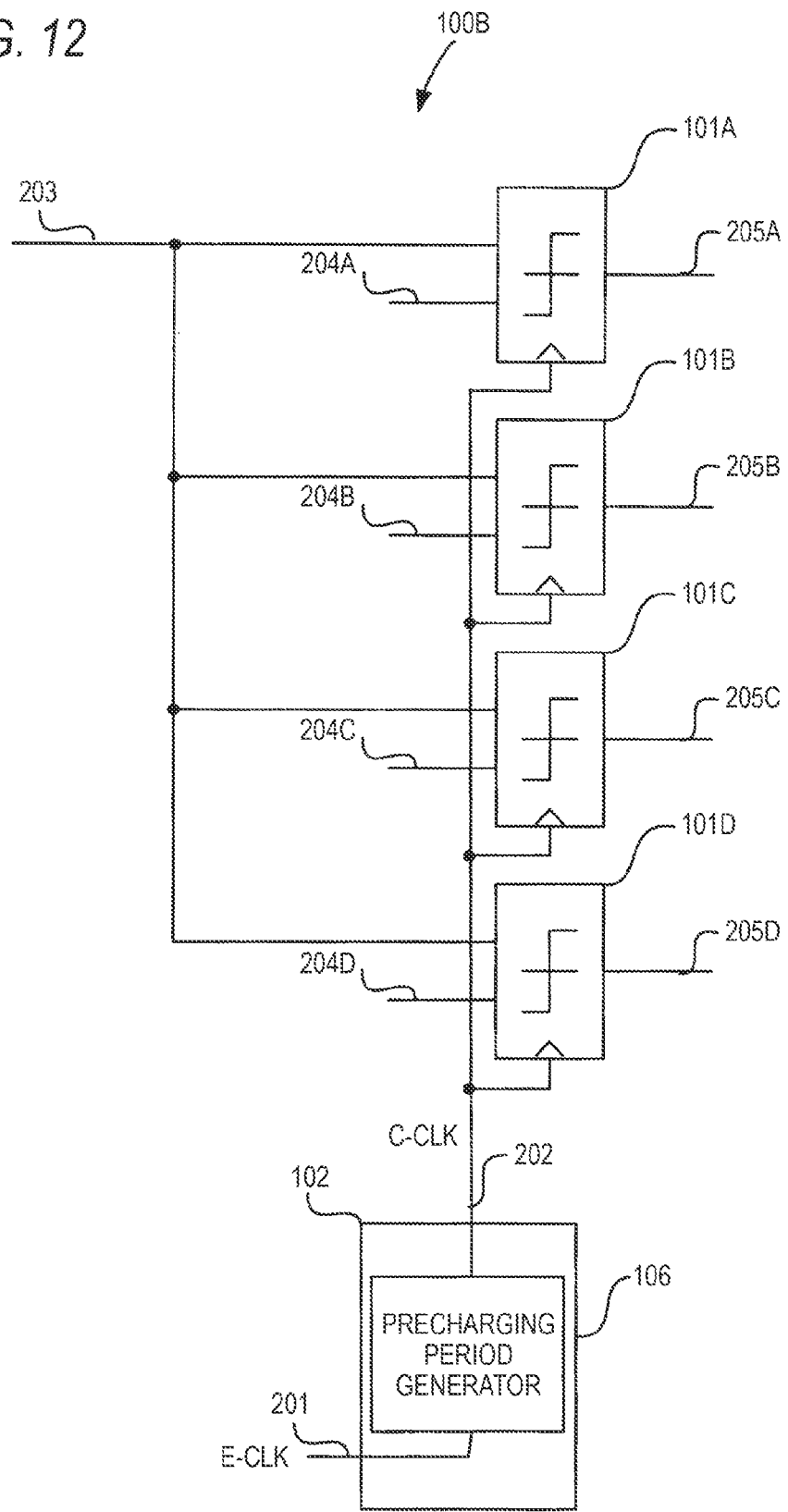
FIG. 12 shows an example configuration of an AD converter according to a second embodiment.

FIG. 12 shows an example configuration of an AD converter 100B, which is a flash AD converter. AD converter 100B is equipped with plural comparators 101A, 101B, 101C, and 101D and a clock generator 102. The number of comparators is not limited to the number of this embodiment.

The comparators 101A-101D receive the same comparator clock 202 which is output from the clock generator 102. Prescribed voltages 204A-204D that are set for the respective comparators 101A-101D are different voltages. Comparison results 205A-205D that are output from the respective comparators 101A-101D are represents by a thermometer code, for example.

For example, the prescribed voltages 204A-204D are set at 950 mV, 900 mV, 850 mV, and 800 mV, respectively. When an input signal 203 is lower than 800 mV, the thermometer code becomes 205A, B, C, D=(0, 0, 0, 0). That is, the comparison results 205A-205D are "0," that is, "low."

An ideal comparator operates in such a manner that its output is rendered in a metastable state when the input voltage is equal to a prescribed value. However, since the output becomes "high" or "low" due to influence of noise, it is assumed in this embodiment that the output becomes "high."

When the input signal 203 is higher than or equal to 800 mV and lower than 850 mV, the thermometer code becomes 205A, B, C, D=(0, 0, 0, 1). That is, the comparison results 205A-205C are "0" and the comparison result 205D is "1," that is, "high."

When the input signal 203 is higher than or equal to 850 mV and lower than 900 mV, the thermometer code becomes 205A, B, C, D=(0, 0, 1, 1). That is, the comparison results 205A and 205B are "0" and the comparison results 205C and 205D are "1."

When the input signal 203 is higher than or equal to 900 mV and lower than 950 mV, the thermometer code becomes 205A, B, C, D=(0, 1, 1, 1). That is, the comparison result 205A is "0" and the comparison results 205B-205D are "1."

When the input signal 203 is higher than or equal to 950 mV, the thermometer code becomes 205A, B, C, D=(1, 1, 1, 1). That is, the comparison results 205A-205D are "1."

In the AD converter 100B, the plural comparators 101A-101D are disposed in parallel and a comparator clock 202 is given to them. According to the AD converter 100B, since all the comparators 101A-101D operate with the same duty ratio, they exhibit the same lowest resolution and the SNR becomes equal to a design value. Therefore, a flash AD converter can be realized that can perform high-accuracy measurements.

Embodiment 3

Figure 13:
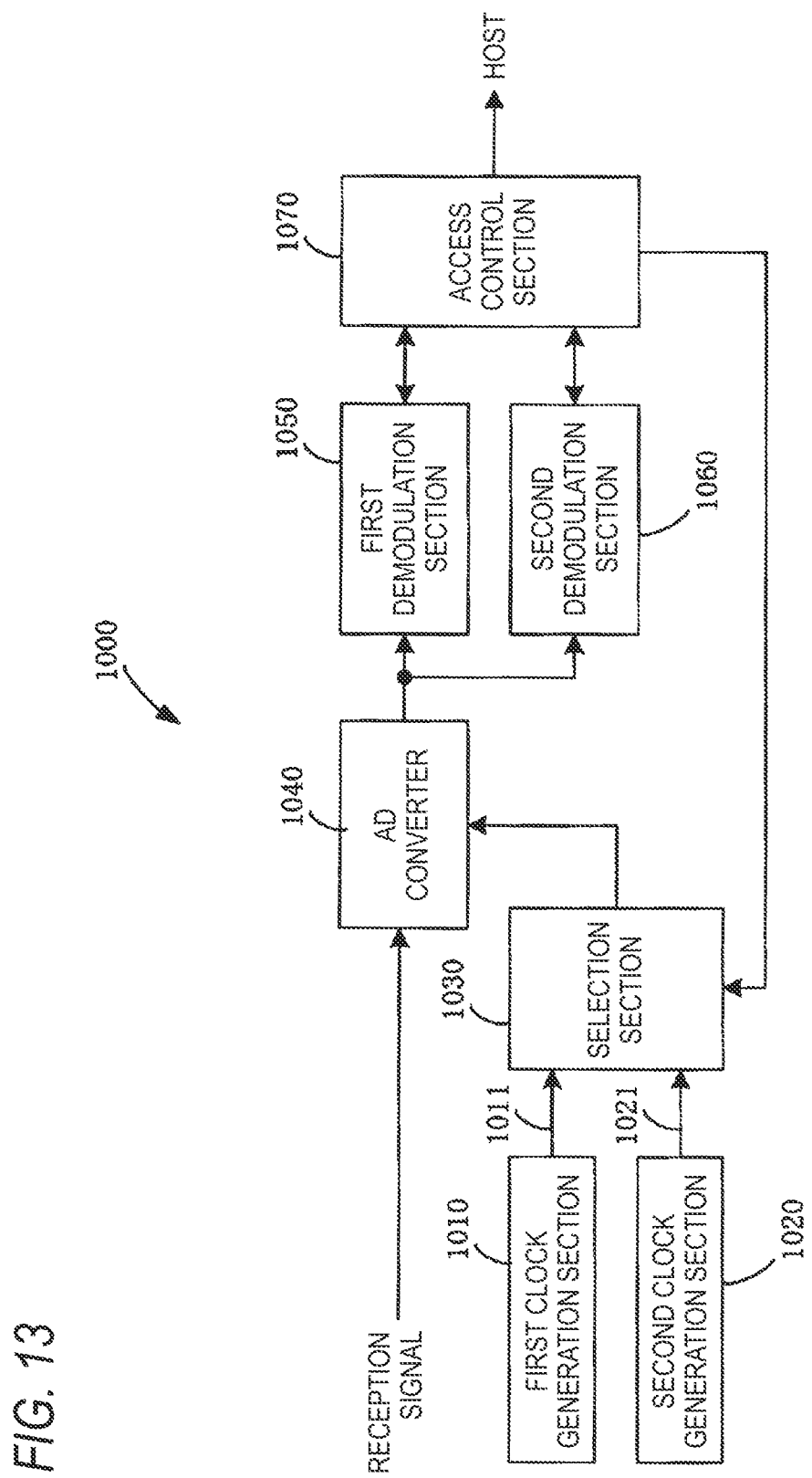
FIG. 13 shows an example configuration of an receiving apparatus according to a third embodiment.

FIG. 13 shows an example configuration of a receiving apparatus 1000 according to a third embodiment, which is a receiving apparatus that complies with plural communications standards. The receiving apparatus 1000 is equipped with a first clock generation section 1010, a second clock generation section 1020, a selection section 1030, an AD converter 1040, demodulation sections 1050 and 1060, and an access control section 1070.

Each of the first clock generation section 1010 and the second clock generation section 1020 is a device for generating a clock and is a quartz oscillator, a pulse generator, or a function generator, for example. The first clock generation section 1010 generates a first clock 1011 for realization of a communication that complies with a first communications standard. The second clock generation section 1020 generates a second clock 1021 for realization of a communication that complies with a second communications standard.

The selection section 1030 selects the first clock generation section 1010 or the second clock generation section 1020 according to an instruction from the access control section 1070.

The AD converter 1040 is the above-described AD converter 100 or 100B. The AD converter 1040 receives an analog reception signal, converts it into a digital signal, and outputs a converted signal.

The first demodulation section 1050 demodulates the digital signal supplied from the AD converter 1040 according to a first communications standard, that is, performs first demodulation processing, when the receiving apparatus 1000 complies with the first communications standard. The second demodulation section 1060 demodulates the digital signal supplied from the AD converter 1040 according to a second communications standard, that is, performs second demodulation processing, when the receiving apparatus 1000 complies with the second communications standard.

The access control section 1070 has functions of estimating a communications standard used for the communication by, for example, using the reception signal and determining a clock to be output from the selection section 1030 and a demodulation processing method to be performed by the first demodulation section 1050 or the second demodulation section 1060.

It is determined in advance between a transmitter and a receiver that the first communications standard should be used at the start of a communication.

The access control section 1070 outputs an output of the demodulation section 1050 or 1060 (e.g., musical file or moving image streaming data) to a host (e.g., PC or application).

In the case of the first communications standard, the selection section 1030 outputs a first clock 1011 generated by the first clock generation section 1010 to the AD converter 1040. Then the first demodulation section 1050 performs demodulation processing on an output of the AD converter 1040.

In the case of the second communications standard, the selection section 1030 outputs a second clock 1021 generated by the second clock generation section 1020 to the AD converter 1040. Then the second demodulation section 1060 performs demodulation processing on an output of the AD converter 1040.

The receiving apparatus 1000 makes it possible to perform demodulation processing according to a communications standard that is estimated from a reception signal. Where the AD converter 1040 is used in a communication system that complies with plural communications standard, the number of effective bits can be increased for a communications standard having a lower sampling rate that corresponds to a clock frequency.

For example, communication according to the IEEE 802.11ad has the SC-PHY mode and the OFDM-PHY mode. In the OFDM-PHY mode, a high resolution (high lowest resolution) though the sampling rate may be set lower than in the SC-PHY mode. The AD converter 1040 can increase the number of effective bits and secure a high resolution by lowering the clock frequency. As such, the AD converter 1040 is suitable for dealing with the two modes of IEEE 802.11ad.

The disclosure is not limited to the configurations of the above embodiments and can be applied to any configuration as long as it can realize the functions described in the claims or the functions of the configuration of each embodiment.

Although each of the above embodiments is directed to the case that the disclosure is implemented by hardware, the disclosure may be implemented by software in cooperation with hardware.

The individual functional blocks used in describing each of the embodiments are typically implemented as LSIs which are integrated circuits. They may be implemented as separate chips or all or part of them may be implemented as one chip. Each such chip may be either called an LSI or called an IC, a system LSI, a super-LSI, or an ultra-LSI depending on its integration density.

The technique for producing an integrated circuit is not limited to that for producing an LSI, and implementation as a dedicated circuit or a general-purpose processor is possible.

For example, an FPGA (field programmable gate array) which can be programmed after manufacture of an LSI or a reconfigurable processor in which the connections or settings of circuit cells provided inside an LSI are reconfigurable may be used.

Furthermore, if an integrated circuit technology to replace the LSI technology appears as a result of advancement of the semiconductor technologies or development of another, spin-off technology, functional blocks may naturally be integrated using that technology. For example, application of a biotechnology is a promising candidate.

The present disclosure is based on Japanese Patent Application No. 2012-197704 filed on Sep. 7, 2012, the disclosure of which is incorporated herein by reference.

INDUSTRIAL APPLICABILITY

The present disclosure is useful when applied to AD converters capable of increasing their conversion accuracy and related receiving apparatus, etc.

DESCRIPTION OF SYMBOLS 100, 100B: AD converter
101, 101A-101D: Comparator
102: Clock generator
105: OR circuit
106: Precharging period generator
107: Inverter
109: NAND circuit
110, 111: Delay control circuit
201: External clock
202: Comparator clock
203: Input signal
204, 204A-204D: Prescribed value
205, 205A-205D: Comparison result
206: NAND latch circuit
207-1, 207-2, 231-1, 231-2: Inverter
217: First clock
218: Second clock
219: Third clock
222: Fourth clock
223: First delay control signal
224: Second delay control signal
1000: Receiving apparatus
1010: First clock generation section
1020: Second clock generation section
1030: Selection section
1040: AD converter
1050: First demodulation section
1060: Second demodulation section
1070: Access control section
T11, T21: Precharging transistor
T12, T22: Input transistor
N11, N12, N21, N22: Internal block

What is claimed is:

1. An AD converter comprising:
a clock generator that generates a first clock using a second clock; and
a comparator comprising:
a comparison circuit that compares an input signal with a prescribed value in a first period of the first clock; and
a precharging circuit that precharges, in a second period of the first clock, an internal voltage to a prescribed value for a next comparison operation,
wherein the clock generator comprises a replica circuit of the precharging circuit of the comparator, and in the replica circuit of the precharging circuit a precharging period from the start to the end of precharging is set as the second period of the first clock.

2. The AD converter according to claim 1, wherein the clock generator generates the first clock on the basis of a delay time in an internal block of the replica circuit of the precharging circuit.

3. The AD converter according to claim 1, wherein the comparator comprises plural stages of internal blocks and a latch circuit;
wherein the comparison circuit comprises:
an input transistor which is included in a first-stage internal block of the plural stages of internal blocks and receives the input signal; and
a second-stage internal block which is one of the plural stages of internal blocks, is connected to the latch circuit, and constitutes a latch; and
wherein the precharging circuit comprises a precharging transistor which is included in the first-stage internal block of the plural stages of internal blocks and receives the first clock.

4. The AD converter according to claim 3, wherein the clock generator comprises plural stages of internal blocks;
wherein a first-stage internal block, among the plural stages of internal blocks, comprises a precharging transistor which receives the second clock and an input transistor which receives a prescribed voltage; and
wherein an internal block which outputs the first clock, among the plural stages of internal blocks, is an internal block formed by changing wiring of the second internal block of the comparison circuit.

5. The AD converter according to claim 1, wherein the clock generator comprises a delay control circuit for adjusting the first period.

6. The AD converter according to claim 1, wherein the first period is equal to the precharging period.

7. The AD converter according to claim 1, wherein the first period is longer than the precharging period.

8. The AD converter according to claim 1, wherein the comparator is a differential comparator.

9. The AD converter according to claim 1, wherein the clock generator includes a transistor having the same physical size as a transistor included in the comparator.

10. The AD converter according to claim 1, wherein the clock generator includes a transistor having the same structure as a transistor included in the comparator.

11. The AD converter according to claim 1, wherein the AD converter comprises plural comparators which are connected to each other in parallel and receive the same first clock which is output from the clock generator.

12. A receiving apparatus which complies with plural communications standard, the receiving apparatus comprising:
an AD converter;
a second clock generator that generates a second clock to be input to the AD converter according to a communications standard;
a demodulator that demodulates a converted signal which is output from the AD converter according to the communications standard; and
an access controller that determines a method of demodulation processing to be performed by the demodulator and the second clock to be generated by the second clock generator, according to the communications standard, wherein the AD converter comprising:
   a first clock generator that generates a first clock using the second clock; and
   a comparator comprising:
   a comparison circuit that compares an input signal with a prescribed value in a first period of the first clock; and
   a precharging circuit that precharges, in a second period of the first clock, an internal voltage to a prescribed value for a next comparison operation,
   wherein the clock generator comprises a replica circuit of the precharging circuit of the comparator, and in the replica circuit of the precharging circuit a precharging period from the start to the end of precharging is set as the second period of the first clock.

* * * * *